United States Patent [19]

Park et al.

[11] 4,153,778

[45] May 8, 1979

[54] ACRYLYL CAPPED URETHANE OLIGOMERS

[75] Inventors: Kisoon Park; George M. Bryant, both of Charleston; Frazier G. Carr, St. Albans, all of W. Va.

[73] Assignee: Union Carbide Corporation, New York, N.Y.

[21] Appl. No.: 891,830

[22] Filed: Mar. 30, 1978

[51] Int. Cl.² .............................................. C08G 18/34
[52] U.S. Cl. ........................................ 528/76; 528/80; 528/81
[58] Field of Search ............... 260/77.5 CR, 77.5 AN, 260/77.5 AP, 77.5 AM; 528/76, 80, 81

[56] References Cited

U.S. PATENT DOCUMENTS

| | | | |
|---|---|---|---|
| 2,929,800 | 3/1960 | Hill | 260/77.5 A |
| 3,412,054 | 11/1968 | Milligan et al. | 260/18 TN |
| 3,700,643 | 10/1972 | Smith et al. | 260/77.5 AN |
| 3,867,318 | 2/1975 | Mishikubo et al. | 260/2 A |

*Primary Examiner*—Maurice J. Welsh
*Attorney, Agent, or Firm*—Francis M. Fazio

[57] ABSTRACT

The reaction produces of (A) polyoxytetramethylene diols or polycaprolactone polyols, (B) diisocyanates and (C) di- or tri-methylol carboxylic acids are capped with (D) certain defined acrylyl compounds to produce terminally unsaturated oligomers that readily cure by thermal or radiation means to soft, tack-free products. The oligomers can be used as coatings; binders and adhesives.

5 Claims, No Drawings

ACRYLYL CAPPED URETHANE OLIGOMERS

BACKGROUND OF THE INVENTION

The manufacture of coated fabrics is a well-established industry. In this field a fibrous substrate is coated with a suitable coating material and cured. In the past the major efforts have involved cure by thermal or electron beam means. Regardless of the cure means employed, however, there has been a major problem, namely, the high viscosity of the materials used. Lower viscosity formulations are preferred for many reasons including ease of handling and application, improved flow on the substrate and lower loading levels. Also compositions that would cure rapidly upon exposure to ultraviolet radiation are also desirable because of the lower energy requirements for curing such compositions. The combination of lower viscosity and rapid ultraviolet cure is of particular interest in the textile field where a coating is often applied at very low loading levels, or at the other extreme saturated on to the substrate as in the manufacture of non-woven materials. The low viscosity permits ready control of the amount of formulation applied and the ultraviolet cure avoids the sometimes harmful effects of thermal treatment of certain fibers.

SUMMARY OF THE INVENTION

It has been found that polyoxytetramethylene diols or polycaprolactone polyols or mixtures thereof can be used to produce acrylyl capped urethane oligomers by reaction with certain di- or tri-methylol carboxylic acids and diisocyanates and capping with the hereinafter defined acrylyl compounds. It has also been found that the polyoxytetramethylene diols or polycaprolactone polyols can initially be chain extended with a diisocyanate prior to reaction as indicated above. The oligomers are useful as coatings, binders and adhesives. They can be cured by thermal or radiation means.

DESCRIPTION OF THE INVENTION

The acrylyl capped urethane oligomers of this invention are the reaction products of four reactants. They can be portrayed by the following simplified formula:

[D-B-(C-B)$_x$]$_y$A in which x is 1 to 3; y is 2 to 5, preferably 2 or 3; A is the residue of the polyoxytetramethylene diol; a polycaprolactone polyol or the same diols or polyols chain extended with a diisocyanate to introduce urethane linkages; B is the residue of the organic diisocyanate; C is the residue of the di- or tri-methylol carboxylic acid; and D is the residue of the acrylyl compound. In this formula C is representative of a di-methylol carboxylic acid; a trimethylol carboxylic acid would have a third group attached to the C residue, a fact obvious to one skilled in this art.

The polyol (A in the formula) can be a polyoxytetramethylene diol as represented by the general formula HO(CH$_2$CH$_2$CH$_2$CH$_2$O)$_z$H. Those diols useful in the production of the oligomers of this invention have a number average molecular weight of from 500 to 10,000, preferably from 500 to 6,000. The polyol (A in the formula) can also be one or more of the polycaprolactone polyols that are commercially available and that are fully described, for example, in U.S. Pat. No. 3,169,945. As described in this patent the polycaprolactone polyols are produced by the catalytic polymerization of an excess of a caprolactone and an organic polyfunctional initiator having at least two reactive hydrogen atoms. The polyols for use herein can be single compounds or mixtures of compounds and either can be used in this invention. The method for producing the polycaprolactone polyols is of no consequence and the organic functional initiators can be any polyhydroxyl compound as is shown in U.S. Pat. No. 3,169,945. Illustrative thereof are the diols such as ethylene glycol, diethylene glycol, triethylene glycol, 1,2-propylene glycol, dipropylene glycol, 1,3-propylene glycol, polyethylene glycol, polypropylene glycol, poly(oxyethylene-oxypropylene) glycols, and similar polyalkylene glycols, ether blocked, capped or heteric, containing up to about 40 or more alkyleneoxy units in the molecule, 3 methyl-1,5-pentanediol, cyclohexanediol, 4,4'-methylene-bis-cyclohexanol, 4,4'-isopropylidene bis-cyclohexanol, xylenediol, 2-(4-hydroxymethylphenyl) ethanol, 1,4 butanediol, and the like; triols such as glycerol, trimethylolpropane, 1,2,6-hexanetriol, triethanolamine, triisopropanolamine, and the like; tetrols such as erythritol, pentaerythritol, N,N,N',N'-tetrakis-(2-hydroxyethyl) ethylene diamine, and the like.

When the organic functional initiator is reacted with the caprolactone a reaction occurs that can be represented in its simplest form by the equation:

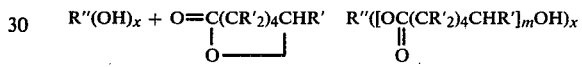

In this equation the organic functional initiator is the R"(OH)$_x$ compound and the caprolactone is the

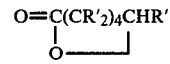

compound; this can be caprolactone itself or a substituted caprolactone wherein R' is an alkyl, alkoxy, aryl, cycloalkyl, alkaryl or aralkyl group having up to twelve carbon atoms and wherein at least six of the R' groups are hydrogen atoms, as shown in U.S. Pat. No. 3,169,945. The polycaprolactone polyols that are used are shown by the formula on the right hand side of the equation; they can have an average molecular weight of from 290 to about 6,000. The preferred polycaprolactone polyol compounds are those having an average molecular weight of from about 290 to about 3,000. In the formula m is an integer representing the average number of repeating units needed to produce the compound having said molecular weights. The hydroxyl number of the polycaprolactone polyol can be from about 15 to 600, preferably from 200 to 500; and the polycaprolactone polyol can have from 2 to 6, preferably 2 to 4 hydroxyl groups.

Illustrative of polycaprolactone polyols that can be used as starting materials in the production of the polycaprolactone derivatives used in the blends of this invention one can mention the reaction products of a polyhydroxyl compound having from 2 to 6 hydroxyl groups with caprolactone. The manner in which these polycaprolactone polyol compositions are produced s shown in U.S. Pat. No. 3,169,945 and many such compositions are commercially available. In the following table there are listed illustrative polycaprolactone polyols. The first column lists the organic functional initiator that is reacted with the caprolactone and the average molecular weight of the polycaprolactone polyol is shown in the second column. Knowing the molecular weights of the initiator and of the polycaprolactone polyol one can readily determine the average number of molecules of caprolactone (CPL Units) that reacted to produce the compound; this figure is shown in the third column.

| | POLYCAPROLACTONE POLYOLS | | |
|---|---|---|---|
| | Initiator | Average MW of polyol | Average No. of CPL Units in molecules |
| 1 | Ethylene glycol | 290 | 2 |
| 2 | Ethylene glycol | 803 | 6.5 |
| 3 | Ethylene glycol | 2,114 | 18 |
| 4 | Propylene glycol | 874 | 7 |
| 5 | Octylene glycol | 602 | 4 |
| 6 | Decalence glycol | 801 | 5.5 |
| 7 | Diethylene glycol | 527 | 3.7 |
| 8 | Diethylene glycol | 847 | 6.5 |
| 9 | Diethylene glycol | 1,246 | 10 |
| 10 | Diethylene glycol | 1,998 | 16.6 |
| 11 | Diethylene glycol | 3,526 | 30 |
| 12 | Triethylene glycol | 754 | 5.3 |
| 13 | Polyethylene glycol (MW 200)* | 713 | 4.5 |
| 14 | Polyethylene glycol (MW 600)* | 1,396 | 7 |
| 15 | Polyethylene glycol (MW 1500)* | 2,868 | 12 |
| 16 | 1,2-Propylene glycol | 646 | 5 |
| 17 | 1,3-Propylene glycol | 988 | 8 |
| 18 | Dipropylene glycol | 476 | 3 |
| 19 | Polypropylene glycol (MW 425)* | 824 | 3.6 |
| 20 | Polypropylene glycol (MW 1000)* | 1,684 | 6 |
| 21 | Polypropylene glycol (MW 2000)* | 2,456 | 4 |
| 22 | Hexylene glycol | 916 | 7 |
| 23 | 2-Ethyl-1,3-hexanediol | 602 | 4 |
| 24 | 1,5-Pentanediol | 446 | 3 |
| 25 | 1,4-Cyclohexanediol | 629 | 4.5 |
| 26 | 1,3-Bis(hydroxyethyl)-benzene | 736 | 5 |
| 27 | Glycerol | 548 | 4 |
| 28 | 1,2,6-Hexanetriol | 476 | 3 |
| 29 | Trimethylolpropane | 590 | 4 |
| 30 | Trimethylolpropane | 761 | 5.4 |
| 31 | Trimethylolpropane | 1,103 | 8.5 |
| 32 | Triethanolamine | 890 | 6.5 |
| 33 | Erythritol | 920 | 7 |
| 34 | Pentaerythritol | 1,219 | 9.5 |

* = Average molecular weight of glycol.

The structures of the compounds in the above tabulation are obvious to one skilled in the art based on the information given. The structure of compound No. 7 is:

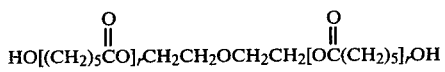

wherein the variable r is an integer, the sum of r+r has an average value of 3.7 and the average molecular weight is 527. The structure of compound No. 20 is:

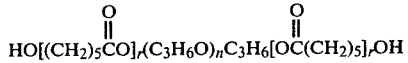

wherein the sum of r+r has an average value of 6 and the average molecular weight is 1,684. This explanation makes explicit the structural formulas of compounds 1 to 34 set forth above.

The polyoxytetramethylene diols and the polycaprolactone polyols can be readily chain extended by procedures known to those skilled in the art by reaction with an organic diisocyanate and this chain extended product is considered equivalent to A in the formula and can be used with equal facility to produce the oligomers of this invention.

The organic diisocyanates (B in the formula) that are used in the production of the oligomers of this invention are well known compounds and many are commercially available. Any of the known diisocyanates can be used and illustrative thereof one can mention 3,5,5-trimethyl-1-isocyanato-3-isocyanatomethylcyclohexane, di(2-isocyanato-ethyl)bicyclo[2.2.1]hept-5-ene-2,3dicarboxylate, 2,4-tolylene diisocyanate, 2,6-tolylene diisocyanate, 4,4'-diphenylmethane diisocyanate, dianisidine diisocyanate, tolidine diisocyanate, hexamethylene diisocyanate, the m-and p-xylyene diisocyanates, tetramethylene diisocyanate, dicyclohexyl-4,4'-methane diisocyanate, cyclohexane diisocyanate, 1,5-naphthalene diisocyanate, 4,4'-diisocyanate diphenyl ether, isophorone diisocyanate, p-phenylene diisocyanate, as well as mixtures thereof.

The di- or tri-methylol carboxylic acids (C in the formula) are the polymethylol carboxylic acids represented by the general formula:

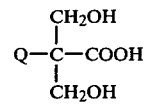

wherein Q repesents hydrogen, alkyl of from 1 to 8 carbon atoms, preferably 1 to 3 carbon atoms, or hydroxymethyl illustrative thereof one can mention 2,2-dimethylol acetic acid, 2,2-dimethylol propionic acid, 2,2 dimethylol pentanoic acid, 2,2-dimethylol octanoic acid, 2,2,2-trimethylol acetic acid, and the like. The preferred acid is 2,2-dimethylol propionic acid. It was found that these defined carboxylic acids are unique among the hydroxyl acids in that they produce little or no carbamic acid or carbon dioxide in their reaction with the isocyanates.

The acrylyl compounds (D in the formula) can be represented by the general formula:

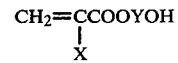

in which X is hydrogen or methyl and Y is a linear or branched divalent alkylene having from 2 to about 5 carbon atoms. The term "acrylyl" signifies both the acrylate and methacrylate groups. Illustrative thereof one can mention 2-hydroxyethyl acrylate, 2-hydroxyethyl methacrylate, 2-hydroxypropyl acrylate, 2-hydroxypropyl methacrylate, 3-hdyroxypropyl acrylate, 2-hydroxypentyl acrylate and the like.

In one embodiment producing the acrylyl capped urethane oligomers of this invention, the polyoxytetramethylene diol or polycaprolactone polyol, or their chain extended urethane derivatives or mixtures thereof are reacted in a first step with a diisocyanate at a temperature of from about 20° C. to about 125° C., preferably 40° C. to 100° C. There is reacted an excess of the diisocyanate with the polyoxytetramethylene diol or polycaprolactone polyol to obtain an isocyanato terminated prepolymer. Thus, for example, at least 2 moles of the diisocyanate compound are reacted per mole of a diol charged or three moles of diisocyanate per mole of triol charged. This chemistry is well known to those skilled in the art of producing isocyanato terminated prepolymers. Further, in those instances in which the chain extended diol urethane derivative is employed, at least 2 moles of the diol are initially or preliminarily reacted with about one mole of the diisocyanate to produce the hydroxyl terminated chain extended urethane derivative. This chain extended urethane derivative is then reacted with at least two moles of the diisocyanate compound to obtain the chain extended iscyanato terminated prepolymer. Similarly chain extended derivatives are produced with the polycaprolactone polyols. The isocyanato terminated prepolymer produced in the first step is then reacted with the di- or tri-methylol carboxylic acid n a second reaction step to produce a hydroxyl terminated intermediate. In this second step, from 2 to 3 moles of prepolymer is reacted with each mole of di- or tri-methylol carboxylic acid employed. The temperature at which the reaction is carried out is the same range as was indicated above. The desired acrylyl capped urethane oligomer of this invention is finally obtained by the reaction of the hydroxyl terminated intermediate produced in the second step with the acrylyl compound and diisocyanate at the same temperatures previously indicated. The quantity of diisocyanate charged is from 0.95 to 1.1 mole per free hydroxyl equivalent present in the hydroxyl terminated intermediate and the amount of acrylyl compound used is based on the analytically determined free isocyanato groups present in the reaction mixture. The procedures for determiing the free isocyanato group are well known to those skilled in the art.

In a second procedural embodiment for the production of the acrylyl capped urethane oligomers of this invention a mixture of polyoxytetramethyene diol or polycaprolactone diol or mixtures thereof and polymethylol carboxylic acid is reacted with excess diisocyanate to produce an isocyanato terminated derivative. This isocyanato terminated derivative is then reacted with the acrylyl compound to obtain the acrylyl capped urethane oligomer. In a still further procedural embodiment for the production of the acrylyl capped urethane oligomers of this invention the polymethylol carboxylic acid can be initially reacted with an excess of the diisocyanate compound to produce the isocyanato terminated derivative. This isocyanato terminated derivative is then reacted with the acrylyl compound and the polyoxytetramethylene diol or the polycaprolactone diol or mixtures thereof to produce the acrylyl capped methane oligomer.

In these latter two procedures the reaction conditions are the same as those described in the initial embodiment.

The reaction between the isocyanato group and the hydroxyl group is carried out under essentially anhydrous conditions in the presence of any of the known urethane catalysts such as the amine or tin compounds. These catalysts are so well known that they should not require more than a brief mention. They include triethylene diamine, morpholine, N-ethyl-morpholine, piperazine, triethanolamine, triethylamine, N,N,N',N'-tetramethylbutane-1,3-diamine dibutyltin dilaurate, stannous octoate, stannous laurate, dioctyltin diacetate, lead octoate, stannous oleate, stannous tallate, dibutyltin oxide, etc. The reaction is preferably carried out by the slow addition of the isocyanate to the mixture of catalyst and acrylate-capped polycaxytetramethylene diol or acrylate-capped polycaprolactone polyol or mixture thereof; an inert solvent can be present if desired.

The curable acrylyl capped urethane oligomers produced by the procedures described above can be used as is or they can be used to produce solvent containing compositions or to produce aqueous emulsions by mixing with water in which an inorganic or organic base such as sodium hydroxide, potassium hydroxide, diethanolamine, triethanolamine, N-methyldiethanolamine, etc., is dissolved, and stirring until a uniform emulsion is formed. The amount of base used is sufficient to give a pH of from 8 to 12. In the aqueous emulsion, the concentration of oligomer and other reactive monomers can range from 10 to 99 weight percent; preferably from 10 to 50 weight percent when lesser quantities thereof are desired on the substrate.

The acrylyl capped polyoxytetramethylene diol urethane oligomers or the acrylyl capped polycaprolactone polyol urethane oligomers can be used either alone or in admixture with a reactive or non-reactive solvent, crosslinkers, pigments, fillers, stabilizers or other additives normally added to coating compositions. These compounds are well known and they are used in the conventional amounts. Along some of the compounds than can be added one can mention toluene, xylene, benzene, dimethylformamide, ethoxyethyl acetone, the acrylate and methacrylate esters, styrene, alphamethylstyrene, 2-ethylhexyl acrylate, methoxyethyl acrylate, butoxyethyl methacrylate isodecyl acrylate, phenyl acrylate, N-methyl acrylamide, ethoxymethyl acrylamide, diethylene glycol diacrylate, trimethylolpropane triacrylate, pentaery-thritol triacrylate, neopentyl glycol diacrylate, 2,2-di-methyl-3-hydroxypropyl, 2,2-dimethyl-3-hydroxypropionate diacrylate, or any of the other known compounds normally used in coatings.

When the compositions are to be cured by thermal means, a free radical initiator or catalyst is present at a concentration of from 0.1 to 5 weight percent. Illustrative thereof are benzoyl peroxide, lauroyl peroxide, di-n-butyl peroxide, t-butyl peracetate, perbenzoic acid, dicumyl peroxide, potassium persulfate, azobisisobutyronitrile, the redox systems, as well as the percarbonate catalysts.

When cure is to be achieved by light radiation, e.g., ultraviolet, a photosensitizer is added at a concentration of from 0.1 to 15 weight percent, preferably 1 to 5 weight percent. These can be used singly, in mixtures, or in combination with known activators or synergists. Illustrative thereof one can mention benzophenone, benzoin, the benzoin ethers, acetophenone, 2,2-diethoxyacetophenone,2,2-dimethoxyphenyl acetophenone, p-methoxybenzophenone, m-chloroacetophenone, chlorothioxanthone, propiophenone, benzil, benzil biacetyl, benzaldehyde, naphthoquinone, anthraquinone, p,p'-dimethylaminobenzophenone, xanthone, etc.

Cure by high energy ionizing electron beam radiation generally does not require the use of activator, catalyst or photosensitizer in the mixture.

When producing the aqueous emulsions one can optionally add from 5 to 20 weight percent of a surfactant to aid in the production of the emulsion. Among the suitable surfactants one can mention the primary and secondary alkanol ethoxylates, the alkylphenol ethoxylates, the alkyl sulfonates and sulfates, the alkylphenyl sulfonates and sulfates, the alkyl phosphates, the alkylphenyl phosphates, phosphates of the alkanol ethoxylates and of the alkylphenol ethoxylates, quarternary alkyl amines, ethoxylated arylamines, and the like.

The oligomers of this invention are applied to the substrate by any of the known means, for example, dippad-squeeze, roller coating, spraying, silk screening, curtain or brushing. They may be preliminarily dried to remove solvent if desired and then cured either thermally or by radiation. Thermal cure is carried out at from 50° C. to 200° C. Radiation cure can be by ionizing or nonionizing radiation using any of the known equipment, e.g., mercury ultraviolet lamps, xenon or krypton arcs, vander Graaff accelerator, linear accelerator, cobalt-60, strontium-90, or other known means. Cure time will vary depending upon the particular formulation, the type of radiation employed, the amount of material applied and other factors, all known in this art.

The following examples serve to further describe the invention. Parts are by weight unless otherwise indicated.

EXAMPLE 1

To a dry reaction flask there were added 300g. of toluene, 383.3g. of polyoxytetramethylene diol having a number average molecular weight of 2,000 65.7g. of isophorone diisocyanate, 0.31g. of dibutyl tin dilaurate and 0.04g. of methoxymethyl-hydroquinone. During this first reaction step the mixture was stirred and purged with dry air for 2.5 hours at 60° C. to produce the hydroxyl terminated chain-extended methane derivative. Then 26.3g of 2,2-dimethylolpropionic acid dissolved in 55g. of dimethylformamide were slowly added to the hydroxyl terminated chain-extended urethane intermediate and reacted in a second step for another 4 hours at 60° C. to produce the hydroxyl terminated intermediate. There were then added in a dropwise manner to the reaction product 43.7g. of isophorone diisocyanate followed by 51.9g of 2-hydroxyethyl acrylate and the mixture was stirred at 60° C. for an additional 4 hours The acrylate capped methane oligomer produced at the conclusion of this final reaction step has a free isocyanato content of 0.6 weight percent, a total solids content of 61.5 weight percent and a room temperature specific Brookfield viscosity of 130,000 cps.

EXAMPLE 2

A 220g. portion of the oligomer solution of Example 1 as vacuum stripped to remove solvents. Stripping was carried out to a temperature of 100° C. and a pressure of 4–5 nm. of mercury and 142g. of the solventfree oligomer was recovered. An aqueous emulsion useful as a fabric coating was produced by mixing 50g. of the stripped oligomer with 60g. of water, 0.5g. of neopentyl glycol diacrylate and 0.05g. of 2,2-diethoxyacetophenone.

EXAMPLE 3

A radiation curable formulation was prepared containing 77.8g. of the acrylate capped oligomer solution produced in Example 1, 1.5g. of neopentyl glycol diacrylate, 0.5g. of 2,2-diethoxyacetophenone and 10g. of toluene.

Films about 4 mils thick were cast on gelatin coated plates and cured by exposure to ultraviolet radiation for 22 seconds. The physical properties of the flexible, tack-free, cured films were determined on a 0.25 by 4 inches simple using an Instron ®Tester TM at a crosshead speed of one inch per minute. These are summarized below:

| | |
|---|---|
| Breaking tensile strength | 2,239 psi |
| Ultimate elongation | 434% |
| Tensile recovery at 100% elongation | 90% |
| Work recovery at 100% elongation | 65% |

EXAMPLE 4

To a dry one-liter round bottom reaction flask, equipped with a condenser, stirrer, heating mantle and thermometer, there were added 108.7g of polycaprolactone diol having an equivalent weight of 265, 202.6g of isophorone diisocyanate and 54.9g of dimethylol-propionic acid. The reaction mixture was heated and purged with dry air while being stirred, to 60° C. for about 45 minutes, after which 9 drops of dibutyl tin dilaurate were added. The reaction was allowed to continue for about six additional hours at 60° C. to produce an isocyanato terminated prepolymer and then free isocyanato content was determined by the well known amine titration method. The free isocyanato concentration was found to be 12.0 weight percent of the prepolymer. The amount of 2-hydroxyethyl acrylate calculated (62.1g) as necessry from the percent free isocyanato, was fed into the reaction mixture; then the reaction was allowed to proceed for about six hours. The acrylyl capped urethane oligomer produced was a viscous light yellow liquid containing only 0.67% free isocyanato. Thirty-six grams of neopentyl glycol diacrylate was added to the oligomer to reduce the viscosity of the latter to Brookfield viscosity of 100,000 cps at 50° C.

EXAMPLE 5

Using apparatus similar to that described in Example 4 a mixture of 300g. of dimethylformamide, 200g. of toluene, 273.4g. of 2,2-dimethylolpropionic acid, 747.9g of isophorone diisocyanate and 0.61g. of dibutyl tin dilaurate was stirred and reacted at about 50° C. for about 12 hours. During the reaction to produce this isocyanato terminated prepolymer solution the reaction mixture was continuously purged wth dry air.

A 360g. portion of the above-produced isocyanato terminated prepolymer solution was placed in a similar reactor together with 100g. of toluene, 0.3g of dibutyl tin dilaurate and 0.04g. of monomethyl hydroquinone. There were slowly added 256.7g. of a polycaprolactone diol having an equivalent weight of 991 and 62.5g. of 2-hydroxyethyl acrylate and the mixture was allowed to proceed for about 6 hours at about 60° C. The acrylate capped urethane oligomer produced had a Brookfield viscosity of 2,900 cps at 50° C. and 14,680 cps at room temperature.

EXAMPLE 6

In a procedure similar to that described in Example 5 a 934 gram portion of the therein produced isocyanato terminated prepolymer solution was reacted with 197.1g. of a polycaprolactone diol having an equivalent weight of 608.4 and 78.3g of 2-hydroxyethyl acrylate; 0.04g. of monomethyl hydroquinone was used as inhibitor. The acrylate capped urethane oligomer produced has a Brookfield viscosity of 8,800 cps at 50° C. and 63,800 cps at room temperature.

In a similar manner an acrylate capped urethane oligomer is produced by substitution of a polycaprolactone triol having an average molecular weight of 300 and an average hydroxyl number of 560 for the polycaporlactone diol used above.

EXAMPLE 7

In a procedure similar to that described in Example 4 an acrylate capped urethane oligomer was produced using 93g. of toluene as solvent, 108.7g. of a polycaprolactone diol having an equivalent weight of 264, 100.3g. of isophorone diisocyanate, 54.9g. of 2,2-dimethylol propionic acid, 94.7g. of 2-hydroxyethyl acrylate, 0.206g. of dibutyl tin dilaurate and 0.028g. of monomethyl hydroquinone. The oligomer produced had a total solids content of 80 weight percent and a free isocyanato content of only 0.6 weight percent.

EXAMPLE 8

A water-borne coating composition was produced by formulating and mixing together 8g. of the acrylate capped urethane oligomer of Example 5, 6.5g. of the diacrylate produced by the reaction of 2 moles of 2-hydroxyethyl acrylate with one mole of isophorone diisocyanate as crosslinkers, 4g. of neopentyl glycol dicacrylate and 0.75g. of benzophenone and 0.5g. N-methyldiethanolamine. The ingredients were mixed together in a vessel and then 10g. of water was added in small increments to produce a smooth opaque dispersion having a total solids content of 79.8 weight percent, pH of 11.4 and a Cannon-Fenske viscosity of 252 cps at 100° F.

The coating composition was applied to a steel panel using a wire wound rod to give a wet film 3 mils thick. This was cured by exposure to ultraviolet radiation to produce a durable, tack-free film having excellent adhesion.

EXAMPLE 9

A. A 369g. portion of the acrylate capped urethane oligomer solution of Example 4 was vacuum distilled at 55° C. and 2.5 mm. of mercury to remove the solvent. There was recovered 320g. of stripped oligomer.

B. A preliminary formulation was produced by rolling a mixture of 289g. of the stripped oligomer of Paragraph A, 30g. diacrylate of 2,2-dimethyl-3-hydroxypropyl, 2,2-dimethyl-3-hydroxypropionate and 3g. of N-methyldiethanolamine on a roller mixer for several hours.

C. An aqueous coating composition was produced by mixing 80.1g. of the preliminary formulation of Paragraph B, with 14.9g. diacrylate of 2,2-dimethyl-3-hydroxypropyl, 2,2-dimethyl-3-hydroxypropionate, 2.9g. of benzophenone and 25g. of water. This composition had a total solids content of 75 weight percent and a Brookfield LVT viscosity of 5,600 cps at 60 rpm. Films cast and cured by the procedures described in Example 3 had an ultimate tensile strength of 4.352 psi, an ultimate elongation of 278% and a tensile recovery at 100% elongation of 64%.

As shown in the examples the acrylyl capped methane oligomers were satisfactorily produced using di- or tri-methylol carboxylic acids as defined by the formula previously set forth. Attempts to use other acids such as tartaric acid or citric acid failed to produce the desired oligomers.

What is claimed is:

1. Acrylyl capped urethane oligomers, said oligomers being the reaction products of (A) a polyoxytetramethylene diol of the formula HO(CH$_2$CH$_2$CH$_2$CH$_2$O)$_z$H having a number average molecular weight of from 500 to 10,000 or a polycaprolactone polyol having an average molecular weight of from 290 to about 6,000 and containing from 2 to 6 hydroxyl groups or mixtures thereof, (B) an organic diisocyanate, (C) a di- or tri-methylol carboxylic acid of the formula:

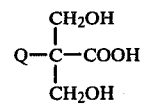

wherein Q is hydrogen, alkyl of from 1 to 8 carbon atoms, or hydroxymethylol and (D) an acrylyl compound of the formula:

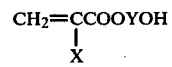

wherein X is hydrogen or methyl and Y is a linear or branched alkyl group having from 2 to 5 carbon atoms.

2. An acrylyl capped urethane oligomer as claimed in claim 1, wherein Component (A) is at least one polyoxytetramethylene diol having a number average molecular weight of from 500 to about 6,000.

3. An acrylyl capped urethane oligomer as claimed in claim 1, wherein Component (A) is at least one polycaprolactone polyol having an average molecular weight of from about 290 to about 3,000 and containing from 2 to 4 hydroxyl groups.

4. An acrylyl capped urethane oligomer as claimed in claim 1, wherein Component (A) is a polyoxytetramethylene diol, Component (B) is isophorone diisocyanate, Component (C) is 2,2-dimethylolpropionic acid and Component (D) is 2-hydroxyethyl acrylate.

5. An acrylyl capped urethane oligomer as claimed in claim 1, wherein Component (A) is a polycaprolactone polyol, Component (B) is isophorone diisocyanate, Component (C) is 2,2-dimethylolpropionic acid and Component (D) is 2-hydroxyethyl acrylate.

* * * * *